Feb. 23, 1965 T. STUTZ 3,170,278

FLEXURAL VIBRATOR FOR NORMAL-FREQUENCY OSCILLATORS, ESPECIALLY IN TIME-MEASURING APPLIANCES

Filed Sept. 18, 1962 2 Sheets-Sheet 1

Inventor
Theo Stutz
by Pierce, Scheffler & Parker
attys

Feb. 23, 1965 T. STUTZ 3,170,278

FLEXURAL VIBRATOR FOR NORMAL-FREQUENCY OSCILLATORS, ESPECIALLY IN TIME-MEASURING APPLIANCES

Filed Sept. 18, 1962 2 Sheets-Sheet 2

Inventor
Theo Stutz
by Pierce, Scheffler & Parker
atty's

United States Patent Office 3,170,278

Patented Feb. 23, 1965

3,170,278

FLEXURAL VIBRATOR FOR NORMAL-FREQUENCY OSCILLATORS, ESPECIALLY IN TIME-MEASURING APPLIANCES

Theo Stutz, Zurich, Switzerland, assignor to Gesellschaft zur Forderung der Forschung an der Eidg. Techn. Hochschule, Zurich, Switzerland

Filed Sept. 18, 1962, Ser. No. 224,901

Claims priority, application Switzerland, Sept. 18, 1961, 10,885/62

12 Claims. (Cl. 58—23)

This invention relates to a flexural vibrator for normal-frequency oscillators, especially in time-measuring appliances. It may be best compared with the tuning forks hitherto used for the same purpose, but differs fundamentally from all types of tuning forks known heretofore, e.g. in the design, in the kind of the path curve on which the vibrating masses move in the space, and in the kind of fixing.

Tuning-fork oscillators have been known for over a hundred years and have proved satisfactory in more recent times, particularly in the form in which an electromagnetic system drives the tuning fork, and the current active therein is controlled electronically. A few years ago an electronic tuning-fork oscillator even become known which is of such small dimensions that it is sold not only as a very small normal-frequency oscillator, but also, built into a wrist-watch, for driving motion work through ratchet mechanism, whereby a portable electronic tuning-fork watch was created.

Thereby one drawback of every tuning fork made itself felt disturbingly; a drawback which could not manifest itself in stationary tuning-fork oscillators: just like a pendulum, by the force of gravity the tuning fork also receives an additional restoring force which is greatest when the fork prongs are directed towards the gravitational center, and then the natural frequency is highest. Horizontally oriented tuning forks remin uninfluenced by this phenomenon, whilst upwardly directed tuning-fork prongs are retarded in their vibrating. This effect cannot be caused to disappear as long as the vibrator has the form of a tuning fork. The quantitative effect of this influence depends on the ratio of the natural ferquency of the tuning fork to the frequency at which a pendulum of identical dimensions and free from spring tension would swing. Consequently, with a given frequency, the error is greater the shorter a tuning fork has to be constructed. In the solution known today of an electronic tuning-fork wrist-watch, this error in time keeping dependent on position is a multiple of that of the other sources of error.

The primary object of the present invention is to provide a flexural vibrator which obviates the aforementioned drawbacks and has, even with relatively small dimensions, a natural frequency independent of the force of gravity.

In contrast to the tuning fork, where the centers of gravity of the two masses vibrating against each other must move on two bent curves, the vibrator according to the invention is characterized in that by its structural shape, the centers of gravity of the two masses vibrating opposite each other are guided on one common straight line, and that its fixing point, or its fixing points rigidly connected to each other, remain stationary in space, when the flexural vibrator is allowed to vibrate in a perfectly resilient suspension.

If an ordinary tuning fork is suspended in a perfectly resilient arrangement and is also nowhere rigidly connected to a carrier, the centers of gravity of the two masses vibrating against each other will, as a matter of fact, also move substantially on one common straight line, but in this case the customary fixing point on the shaft of the fork will move at right angles thereto with double the vibration frequency. In contradistinction to the tuning fork, the flexural vibrator according to the invention has the property that its fixing points, rigidly connected to each other, even with this dynamic method of consideration, remain exactly at rest mathematically. The definition must therefore start from a plurality of fixing points, because in separate forms of embodiment it is of advantage structurally to connect the vibrator to a rigid carrier at more than one place. Decisive is then the behavior of the totality of these fixing points, as it is achieved by rigid connection between them.

The accompanying drawing shows by way of example some forms of embodiment incorporating the invention.

Figure 1:
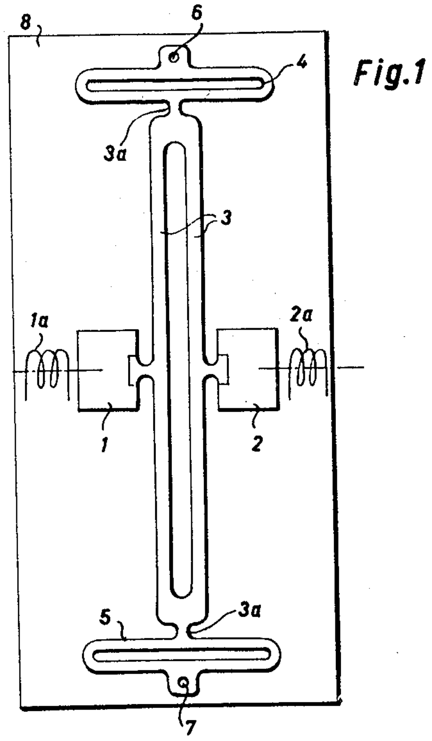
FIGS. 1 and 2 are two similar forms of embodiment of the flexural vibrator with two differnt kinds of fixing.

Referring to FIG. 1, two identical vibratory masses 1 and 2 are fixed to a spring body 3 determining the vibrating. This body has the form of two parallel flexural bars which are connected at their two ends rigidly to each other, and each in their middle to one of the masses 1 and 2. The connected ends of said bars are joined by means of webs **3*a* on two spring pieces which in turn are connected to a rigid carrier 8 through fixing points 6 and 7. Said spring pieces 4 and 5 have the form of flat-pressed rings and are so designed and arranged that the webs 3*a* are yieldingly held in the direction of the straight line connecting the two fixing points 6 and 7 and parallel to the longitudinal direction of the flexural bars of the spring body 3. The straight line connecting the two fixing points 6 and 7 runs at right angles to the straight line connecting the centers of gravity of the two masses 1 and 2. Each of said connecting straight lines is also an axis of symmetry of the flexural vibrator. The masses 1 and 2 are the movable parts of two electro-mechanical converters, whose coils 1*a* and 2*a*** are indicated diagrammatically and belong to an electric oscillator, with whose help the described flexural vibrator is excited to vibrate.

As with the tuning fork, there are two types of natural vibration:

In the first type of vibration, which is generally the only one desired, the masses 1 and 2 and the two bars of the spring body 3 vibrate in opposition. The impulses of the two vibrating parts lying to the left and right are opposite and equal, and the vibrator exerts no alternating forces on the carrier 8 through the fixing points 6 and 7. In the second type of vibration which is not used with a normal-frequency transmitter but which must, in the case of portable appliances, be considered because of possible excitation by disturbances, the two masses 1 and 2 vibrate in the same sense, whereby the forces are transmitted to the carrier 8 through the fixing points 6 and 7.

From the symmetries of the vibrator shown, it is at once evident that the centers of gravity of the two parts of moving masses 1 and 2 are guided on one common straight line which is the one connecting the centers of mass. Therewith the natural frequency of both types of vibration is independent of the amount and direction of the acceleration due to gravity, because the corresponding pendulum would be infinitely long and thus be degenerated to an infinitely slow vibration.

With an opposite movement rectilinear of the two masses 1 and 2 along a common axis of vibration, the length of the bars of the spring body 3 does not change in a first approximation; it does so only as a function of the square of the momentary deflection of the masses 1 and 2 from their positions of equilibrium. The fixing of the webs **3*a*** can thus in first approximation not influence the natural frequency of vibration in the opposite sense. On the other hand, the condition of straight-line guiding of the centers of gravity of the vibrating parts requires that the two webs $3a$ are connected to the carrier 8 through equally great mechanical impedances, and this is ensured by the two spring pieces 4 and 5 that are similar in their properties. If the carrier 8 is attached in a perfect spring arrangement, it does not make any movements if the masses 1 and 2 vibrate in opposition.

Figure 2:
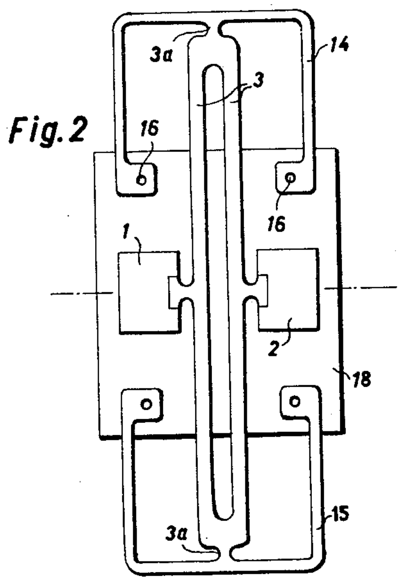

The embodiment shown in FIG. 2 differs from that according to FIG. 1 only by a different manner of connecting the two webs $3a$ to a rigid carrier. Instead of the annular spring pieces 4 and 5, there are now provided U-shaped spring stirrups 14 and 15 entirely similar to each other, whose ends are connected to a rigid carrier 18 through fixing points 16 and 17 respectively, whilst the middle portions of the two spring stirrups 14 and 15 are connected to the webs $3a$. Through this design, the webs $3a$ are not only enabled to move in a direction parallel to the longitudinal axes of the flexural bars of the spring member 3, but also in a direction parallel to the path of movement of the centers of gravity of the masses 1 and 2. This gives the designer more freedom in selecting the natural frequency for vibrations in the same direction of the masses 1 and 2, so that it is possible to choose the natural frequency much lower than the natural frequency for vibrations in opposite directions of the masses 1 and 2. Otherwise, with regard to the vibrations of the masses 1 and 2 and the flexural bars of the spring body 3 connected thereto, the same holds good as in the first embodiment.

Figure 3:
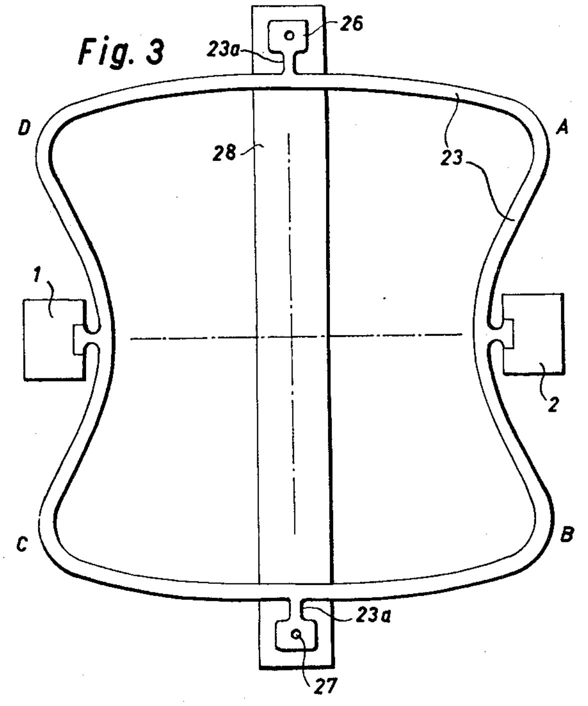
FIGS. 3 and 4 are two further forms of embodiment similar to each other, likewise with two different kinds of fixing.

FIG. 3 shows a form, in which the properties of the spring body 3 and those of the spring pieces 4, 5 and 14, 15 respectively according to FIGS. 1 and 2 are united on a single annular-like continuously curved spring body 23 which is equivalent to a torus topologically. The identical vibratory masses 1 and 2 are fixed at two opposite median points on concavely curved sides of the toroidal spring body 23, whilst two other likewise opposite median points on convexly curved sides of the toroidal spring member 23 are connected by webs $23a$ to the fixing points 26 and 27 which are supported on a rigid carrier 28. The straight line connecting the fixing points 26 and 27 runs at right angles to the straight line connecting the centers of gravity of the masses 1 and 2. Each of said connecting straight lines is an axis of symmetry of the flexural vibrator.

As illustrated in FIG. 3, the toroidal spring body 23 has at four places A–D a greater curvature; moreover it has such shapes and dimensions that, in case the masses 1, 2 vibrate in opposition to each other, no forces at all are transmitted to the carrier 28 or, which means the same thing, that the fixing points 26, 27 do not move, even if they are detached from the carrier. That such a design is possible, one realizes from the following: If the portions A–B and C–D were softer than the portions B–C and D–A of the toroidal spring body 23, in the case the masses 1 and 2 were pressed together, the detached fixing points 26, 27 would approach each other. Should, inversely, the portions D–C and D–A be especially soft, when the masses 1, 2 were pressed together, the detached fixing points 26, 27 would move apart. Between these extreme cases, there lies the case structurally realized here that the detached fixing points 26 and 27 remain at rest in the first approximation. For taking up deflections of higher order, in the form according to FIG. 3 no further springs are needed, since the toroidal spring body 23 has resiliency sufficiently soft in the direction of the straight line connecting the fixing points 26 and 27, in order to be able to take over this additional function. This second spring flexure must always take place symmetrically to the straight line connecting the centers of gravity of the two masses 1, 2. The centers of gravity of the vibrating masses 1, 2 are then guided by the toroidal spring body 23 on one common straight line which is identical with the straight line connecting the centers of gravity. If the carrier 28 is suspended in a perfect spring arrangement, in case the masses vibrate in opposition, the carrier 28 makes no movements at all.

Figure 4:
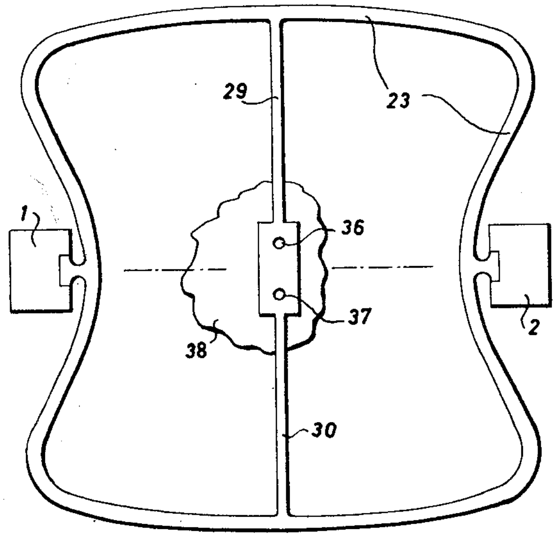

The embodiment shown in FIG. 4 features a spring body which has a configuration essentially identical with that of FIG. 3 and differs from that according to FIG. 3 only in that, instead of the webs $23a$, there are provided much longer resiliently pliable supporting arms 29 and 30 which extend towards each other along the axis of symmetry of the toroidal spring body 23 and are connected to two fixing points 36 and 37 which are united to each other. The supporting arms 29, 30 of the fixing points 36, 37 are symmetrically arranged with respect to the straight line connecting the centers of gravity of the two masses 1 and 2. The action of the flexural vibrator is the same as in the foregoing example. The arms 29, 30, however, give the designer more freedom in selecting the natural frequency for vibrations of the masses 1 and 2 in the same direction.

All embodiments disclosed hereinbefore have in common that, practically, neither the magnitude nor the direction of the gravitational field exerts any influence on the vibration frequency with movement of the vibrating masses in opposite directions, because the centers of gravity of the masses vibrating in opposition move on one common straight line. The vibration frequency is thus independent of the orientation of the flexural vibrator in space, for which reason the flexural vibrator is also extremely suitable for portable normal-frequency oscillators, particularly in time-measuring applances, such as wrist-watches.

What I claim is:

1. In a flexural vibrator for normal-frequency oscillators, the combination comprising a symmetrical spring body, said spring body being symmetrical with respect to two mutually perpendicular axes of symmetry and including a pair of spaced spring arms, identical masses secured respectively to intermediate portions of said spring arms for rectilinear vibratory motions in opposite directions along one of said axes of symmetry, means connecting together the opposite end portions of said spring arms, and means including web means connecting each of the interconnected end portions of said spring arms to a fixing point on a rigid carrier member for the spring body, said web means being located in spaced relation on said carrier member along the other of said axes of symmetry.

2. A flexural vibrator as defined in claim 1 wherein said spaced spring arms of said spring body are constituted by parallel spaced rectilinear spring bars and wherein said means connecting the interconnected end portions of said spring arms to said fixing points comprises auxiliary spring means one end of which is connected to the correlated fixing point and the other end to the correlated means.

3. A flexural vibrator as defined in claim 2 wherein each of said auxiliary spring means is comprised of an elongated spring loop positioned with its major axis parallel to the axis of symmetry along which said masses vibrate.

4. A flexural vibrator as defined in claim 2 wherein each of said auxiliary spring means is comprised of a U-shaped spring stirrup, the middle portion of each said stirrup being connected to the correlated web means and the ends of each said stirrup being connected to the correlated fixing point on said rigid carrier member.

5. A flexural vibrator as defined in claim 1 wherein said web means and said fixing points are all located along the other of said axes of symmetry.

6. A flexural vibrator as defined in claim 1 wherein said spaced spring means and the means connecting together the opposite end portions of said spring arms are established by a unitary toroidal-like spring body.

7. A flexural vibrator as defined in claim 6 wherein each of said web means extends outwardly from said toroidal-like spring body to the correlated fixing point on said rigid carrier member.

8. A flexural vibrator as defined in claim 6 wherein each of said web means extends inwardly into the interior of said toroidal-like spring body to the correlated fixing point on said rigid carrier member.

9. In a flexural vibrator for normal frequency oscillators, the combination comprising a continuously curved spring body having an annular-like configuration including a first pair of oppositely disposed convexly curved sides connected by curvilinear parts to a second pair of oppositely disposed concavely curved sides, said spring body being symmetrical with respect to mutually perpendicular axes extending through median points on said oppositely disposed pairs of convexly and concavely curved sides, identical masses secured to median points on one pair of said curved sides, and means including web means securing the other pair of curved sides at the median points thereof to a rigid carrier member.

10. A flexural vibrator as defined in claim 9 wherein said masses are secured to median points on said concavely curved sides.

11. A flexural vibrator as defined in claim 9 wherein said masses are secured to median points on said concavely curved sides and said web means extend outwardly along the corresponding axis of symmetry from median points on said convexly curved sides to securing points on said carrier member.

12. A flexural vibrator as defined in claim 9 wherein said masses are secured to median points on said concavely curved sides and said web means extend inwardly along the corresponding axis of symmetry from median points on said convexly curved sides to securing points on said carrier member.

References Cited by the Examiner

UNITED STATES PATENTS

| | | | |
|---|---|---|---|
| 694,778 | 3/02 | Perret | 58—23 |
| 1,781,513 | 11/30 | Holweck | 58—23 |
| 2,861,256 | 11/58 | Hart | 340—6 |
| 2,928,069 | 3/60 | Peterman | 58—23 |
| 2,939,971 | 6/60 | Holt | 310—15 |

FOREIGN PATENTS

| | | |
|---|---|---|
| 1,215,880 | 4/60 | France. |

LEO SMILOW, *Primary Examiner.*

JOSEPH P. STRIZAK, LEYLAND M. MARTIN, *Examiners.*